United States Patent [19]

Nagafuchi et al.

[11] Patent Number: 5,110,400
[45] Date of Patent: May 5, 1992

[54] APPARATUS FOR BONDING CONTINUOUS THIN FILM TO DISCRETE BASE PLATES AND CUTTING THEREOF

[75] Inventors: Yasuhiro Nagafuchi, Chiba; Mitsuhiro Seki, Tokyo; Shigeo Sumi, Saitama; Fumio Hamamura, Kanagawa, all of Japan

[73] Assignee: Somar Corporation, Tokyo, Japan

[21] Appl. No.: 500,984

[22] Filed: Mar. 29, 1990

[30] Foreign Application Priority Data

Mar. 29, 1989 [JP] Japan .................................. 1-77886
Apr. 29, 1989 [JP] Japan ................................ 1-109831

[51] Int. Cl.$^5$ .............................................. B32B 31/18
[52] U.S. Cl. .................................. 156/521; 156/522; 156/552; 83/305
[58] Field of Search ............... 156/510, 517, 521, 522, 156/552; 83/305

[56] References Cited

U.S. PATENT DOCUMENTS

| | | | |
|---|---|---|---|
| 3,750,510 | 8/1973 | Gabriels | 83/305 |
| 4,323,416 | 4/1982 | Malthouse et al. | 156/521 |
| 4,964,937 | 10/1990 | Selci | 156/521 |
| 4,986,873 | 1/1991 | Hamamura | 156/552 |

FOREIGN PATENT DOCUMENTS

| | | |
|---|---|---|
| 0116659 | 8/1984 | European Pat. Off. . |
| 0360269 | 3/1990 | European Pat. Off. . |
| 1-178433 | 7/1989 | Japan . |

Primary Examiner—Caleb Weston
Attorney, Agent, or Firm—Sughrue, Mion, Zinn, Macpeak & Seas

[57] ABSTRACT

A method and apparatus for bonding thin film supplied from a continuous roll to at least one bonding surface along the entire length of a discrete printed surface base plate and efficiently cutting the film to a proper length which covers an entire planar surface of the board. Each board is conveyed to a film bonding position and the leading end of the continuous film is transported to the film bonding position that is held by suction. A compression bonding roller moves across the surface of the board and automatically feeds film and bonds the film to the board while leaving a portion of the film loose over the trailing end of the board. A cutter comprising a rotary blade and a fixed blade disposed across the direction of movement of the film and the board is mounted on a slide bed which is moveable towards and away from the film. The rotary blade is obliquely oriented in order to permit the cutting of the film when the blade is rotated in opposition to the fixed blade. The compression bonding roller then completes the bonding of the loose end of the film through the remaining portion of the board. This structure permits a wide film to be rapidly and positively cut and bonded to the board.

4 Claims, 8 Drawing Sheets

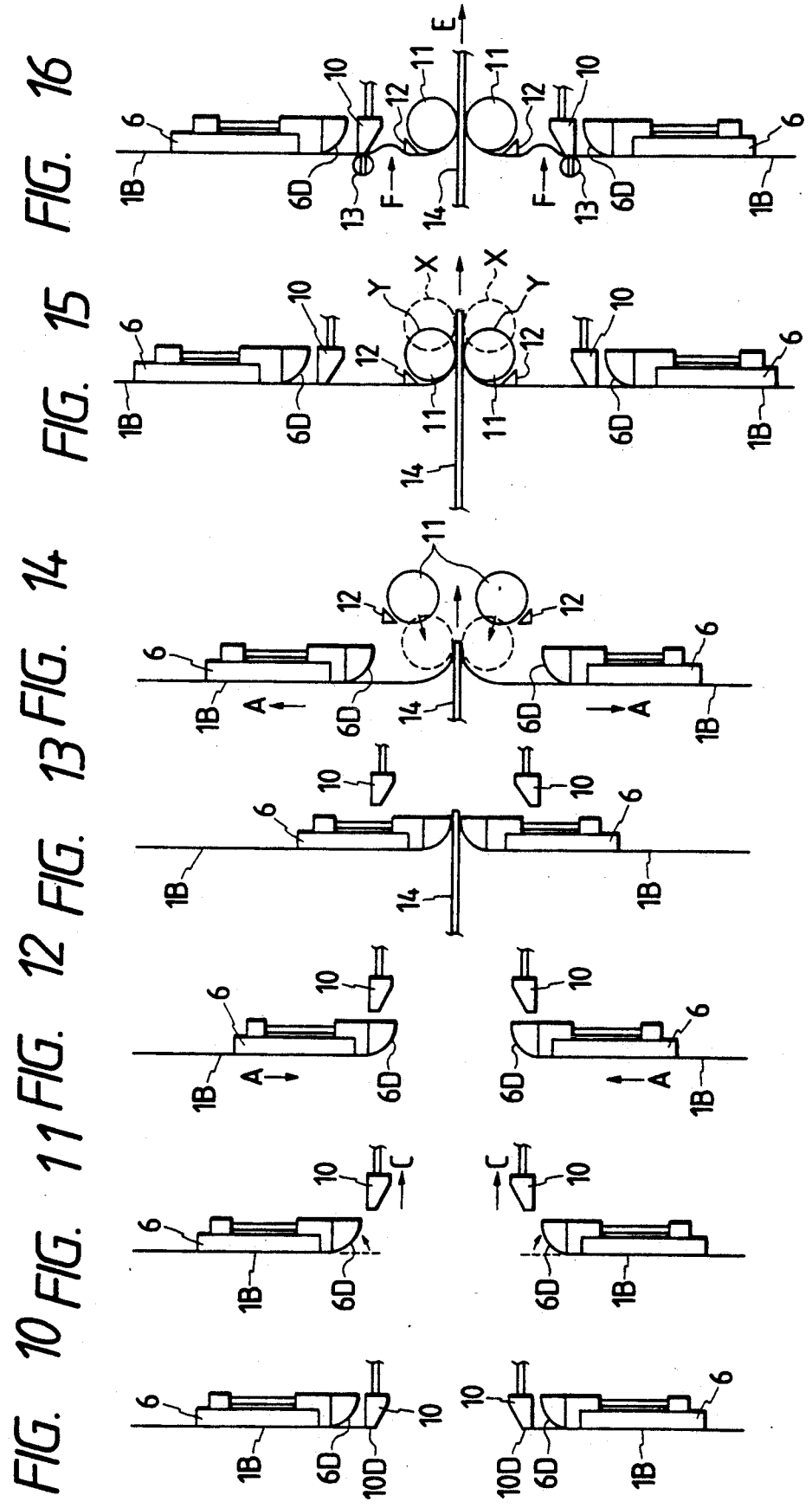

APPARATUS FOR BONDING CONTINUOUS THIN FILM TO DISCRETE BASE PLATES AND CUTTING THEREOF

BACKGROUND OF THE INVENTION

1. Field of the Invention

This invention relates generally to a film bonding method and an apparatus for performing such a method, and more particularly to a method of, and apparatus for thermocompression-laminating a laminate film composed of a photosensitive resin layer and a light-permeable resin film, from a continuous roll onto discrete boards for printed circuits.

2. Description of the Prior Art

In conventional film bonding machines, boards for printed circuits are conveyed by a conveyer or the like, to a bonding station and a laminate film is fed from a continuous roll to the bonding station where it is cut to length corresponding to the length of the board and is bonded then thereto. As a device for cutting this laminate film, a movable cutter, comprising having a rotary disc blade reciprocally movable across of the laminate film, is used.

With the above conventional movable cutter, in order for the transversely-movable rotary disc blade to accurately cut the moving laminate film in a direction perpendicular to the laminate film, the reciprocal movement of the movable cutter must be effected quite rapidly. More specifically, the laminate film ordinarily has a width of about 600 mm, and therefore the rotary disc blade cutter must be moved a distance of about 700 mm.

The conventional movable cutter has a limited speed of movement and, therefore, the feed rate or speed of the laminate film is necessarily limited. For example, if the maximum speed of the movement of the rotary cutting disk is such that it takes about a half second for the disc to be moved by 700 mm, the maximum speed of the movement of the laminate film can only be about 3 m/min. Further, when the rotary disc blade cutter is abruptly moved and then stopped, a great impact is applied to guide members for the cutter. This impact results in damage to parts of the apparatus and high maintenance costs.

It is therefore an object of this invention to provide film a bonding method and apparatus in which a wide film can be quickly cut by a rotary cutter, so that a length of the film thus cut can be rapidly bonded.

Another object of the subject invention is to provide a rotary film cutter which prevents impact to associated guide members.

A further object of the invention is to provide a film bonding apparatus which is simple in construction.

These and other objects and novel features of the present invention will become manifest apparent upon making from the following detailed description with reference to the accompanying drawings.

SUMMARY OF THE INVENTION

The above objects have been achieved by a method and apparatus for bonding a film, having a length corresponding to the length of a board, to a film bonding surface of the board by a compression bonding roller. The method is accomplished by the apparatus having: a board conveying mechanism for conveying the boards to a film bonding position and for retracting the board from the film bonding position, a film feed member for holding a leading end of the continuous film by suction and for feeding the leading end to the film bonding position.

a film leading-end-holding member having a holding surface disposed in the vicinity of the film bonding position for face-to-face contact with the leading end of the film fed by the film feed member to the film bonding position, film suction apertures being formed in the holding surfaces and being connectable to a vacuum system so as to hold the leading end of the film by suction, a rotary cutter having a fixed blade mounted on the film leading end-holding member, and a rotary blade mounted on a body of the apparatus so as to be movable toward and away from a front side of the film, a mechanism for moving the film leading end-holding member toward and away from a reverse side of the film, and a compression bonding roller for bonding the film, held by the film feed member in the film bonding position, from its leading to trailing end to the film bonding surface of the board from its leading to trailing end.

The compression bonding roller is moved toward the leading end of the film held by the film feed member in the film bonding position, and feeds the film automatically through the rotation of the compression bonding roller so as to bond the film to the film bonding surface of the board over a first predetermined distance from the leading end of the board toward the trailing end of the board. The compression bonding roller and the board are moved a second predetermined distance in the direction of feed of the board while the film is being bonded to the board, and subsequently are moved a predetermined distance in a direction opposite to the direction of feed of the board so as to loosen the film.

A rotary cutting blade is mounted at its opposite ends on a slide bed movable toward and away from the front side of the film on a support plate extending from a base. The slide bed being capable of is fixed in a predetermined position relative to the support plate and also can be moved forwardly, away from the film.

With the above structure, the leading end of the continuous film is held by the film feed member under suction, and the film feed member is moved toward the leading end of the film bonding surface of the board, fed to the film bonding position, to feed the leading end of the continuous film and to retain the leading end of this film at the film bonding position. The film feed member is moved away from the film bonding surface of the board, and the compression bonding roller is moved toward the leading end of the film retained at the film bonding position. The compression bonding roller is rotated to automatically feed the film and to bond the film to the film bonding surface of the board over a predetermined distance from the leading end of the board toward its trailing end. At this time, the compression bonding roller, while bonding the film to the board, is moved together with the board a predetermined distance in the direction of feed of the board, and thereafter is moved in the direction opposite to the direction of feed of the board to loosen the film. Then, the film is cut in such a manner that the cut length of the film corresponds to the length of the board in the direction of feed of the board. The trailing end portion of the cut length of the film is bonded to the trailing end portion of the film bonding surface of the board. Therefore, with such a simple construction, the wide film can be rapidly and positively cut and bonded to the board.

By virtue of the provision of the rotary cutter which comprises a rotary blade and a fixed blade both arranged across the film, the film can be cut or sheared through the cooperation of the rotary blade and the fixed blade upon instantaneous normal and reverse rotation of the rotary blade. Therefore, the wide film can be rapidly and positively cut.

Also, since the member rotatably supporting the rotary blade is designed to be movable, the insertion of the continuous film before starting the operation can be facilitated, which provides for improved operability.

Further, the rotary blade is angularly movably mounted at its opposite ends on the slide bed movable toward and away from the film on the support plate extending from the base. The slide bed can be fixed in a predetermined position relative to the support plate and also can be moved away from the film. The fixed blade is mounted on the film leading end-holding member movable toward and away from the reverse side of the film. Therefore, the film can be cut rapidly, and the guide members for the rotary cutter are not subjected to large impact.

BRIEF DESCRIPTION OF THE DRAWINGS

FIGS. 10 to 16 are schematic views illustrative of a laminating operation of the apparatus of FIG. 1;

DESCRIPTION OF THE PREFERRED EMBODIMENTS

Figure 1:
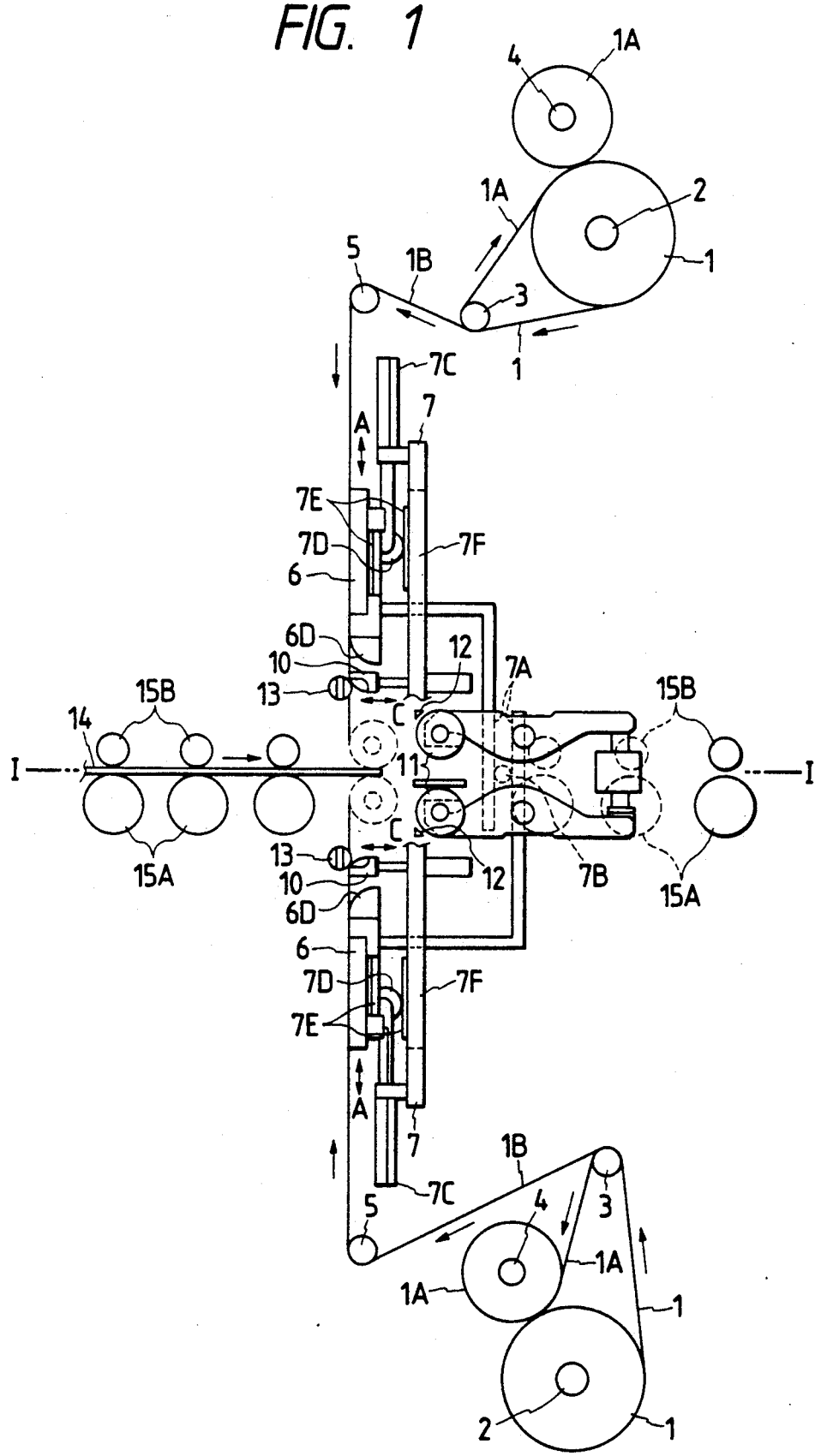
FIG. 1 is a schematic view of the overall construction of a preferred embodiment of an apparatus of the present invention.

The invention will now be described by way of a preferred embodiment thereof with reference to the drawings.

In all the figures of the drawings, the parts performing the same functions are denoted by the same reference numerals, respectively, and a repetition of explanation of the similar parts will be omitted.

FIG. 1 schematically shows a preferred embodiment of a film bonding apparatus of the invention for thermocompression-laminating a laminate film, composed of a photosensitive resin layer and a light-permeable resin film, onto each side (i.e., front and reverse sides) of a board 14 for a printed circuit.

As shown in FIG. 1, the film bonding apparatus of this embodiment comprises a pair of supply rollers 2 each having the laminate film 1 being composed of three layers (i.e., a light-permeable resin film, a photosensitive resin layer and a light-permeable resin film). The laminate film 1 on each supply roller 2 is separated by a film separating roller 3 into the light-permeable resin film 1A (protective film) and a laminate film 1B composed of the other light-permeable resin film and the photosensitive resin layer having one side (adhesive surface) exposed.

The light-permeable resin film 1A thus separated is taken up by a take-up roller 4. The pair of supply rollers 2 as well as the pair of take-up rollers 4 are arranged respectively on the upper and lower sides of a path of travel of boards indicated by I—I and spaced equidistantly therefrom.

Figure 2:
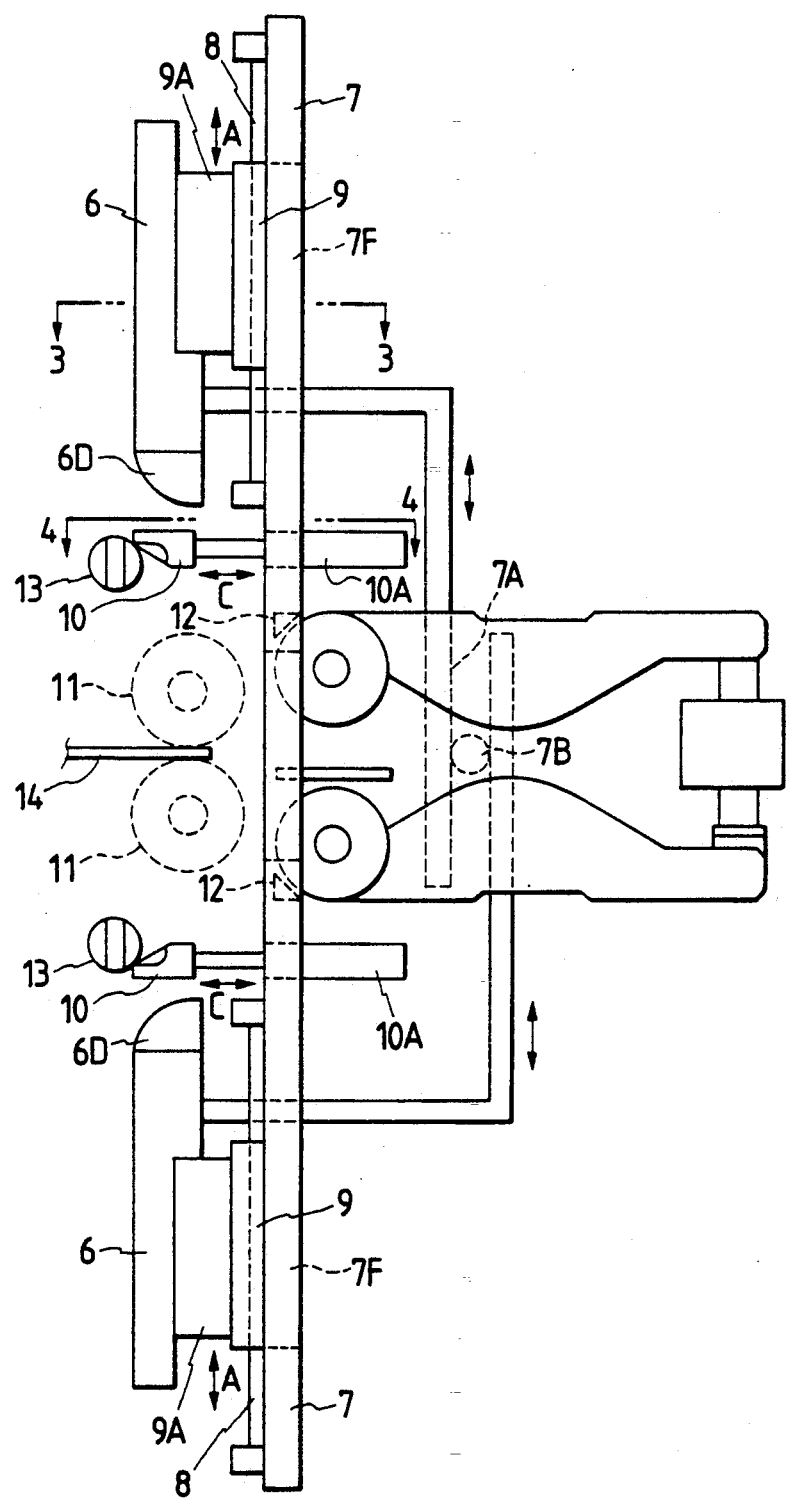
FIG. 2 is an enlarged view of an important portion of the apparatus of FIG. 1.
Figure 3:
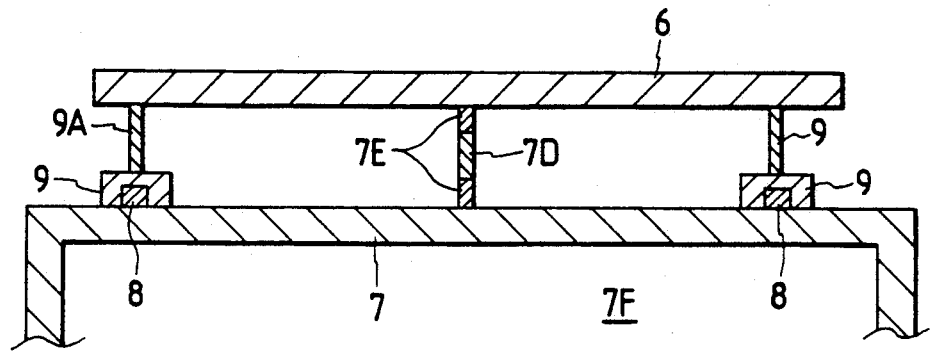
FIG. 3 is a cross-sectional view taken along the line 3—3 of FIG. 2.

The leading end of the separated laminate film 1B in the direction of its feed is fed to a main vacuum plate (film feed member) 6 via a tension roller 5, as shown in FIG. 1. As shown in FIG. 1, FIG. 2 (enlarged view of an important portion of FIG. 1) and FIG. 3 (cross-sectional view taken along the line-3—3 of FIG. 2), the main vacuum plate 6 is designed to be movable toward and away from a film bonding position in directions indicated by double-head arrow A. More specifically, the main vacuum plate 6 is mounted on support integrally connected to support member 9 slidably mounted on guide rails 8 which are mounted on a body 7 of the apparatus (i.e., a frame of the film bonding apparatus). The pair of main vacuum plates 6 are arranged respectively on the upper and lower sides of the board travel path I—I and are spaced equidistantly therefrom, the two main vacuum plates being moved toward and away from each other by a rack-and-pinion mechanism which comprises racks 7A and a pinion 7B in mesh with the racks 7A. Reference numeral 7F denotes a channel formed by body 7. A drive source 7C comprises, for example, an air cylinder. Each main vacuum plate 6 is moved by a respective drive source 7C, mounted on the apparatus body 7 and a rack-and-pinion mechanism connected to the drive source. This rack-and-pinion mechanism comprises a pinion 7D connected to a rod of the drive source 7C, a rack 7E mounted on the apparatus body 7 and a rack 7E mounted on the reverse side of the main vacuum plate 6 which is not a suction surface for holding the laminate film 1B, as seen in FIG. 3. Thus, the main vacuum plates 6 can move in the directions of the arrow A independently of each other.

A forward end portion 6D of the main vacuum plate 6 disposed near the film bonding position has the film suction surface of an arcuate shape, and a plurality of film suction apertures are formed therein. Against the resiliency of the laminate film 1B, the leading end of the laminate film 1B in the direction of fee thereof can be held on the arcuate surface of the forward end portion 6D by suction. The leading end held on the forward end portion 6D by suction is fed to the film bonding position when the main vacuum plate 6 is moved in the direction of the arrow A.

Figure 4:
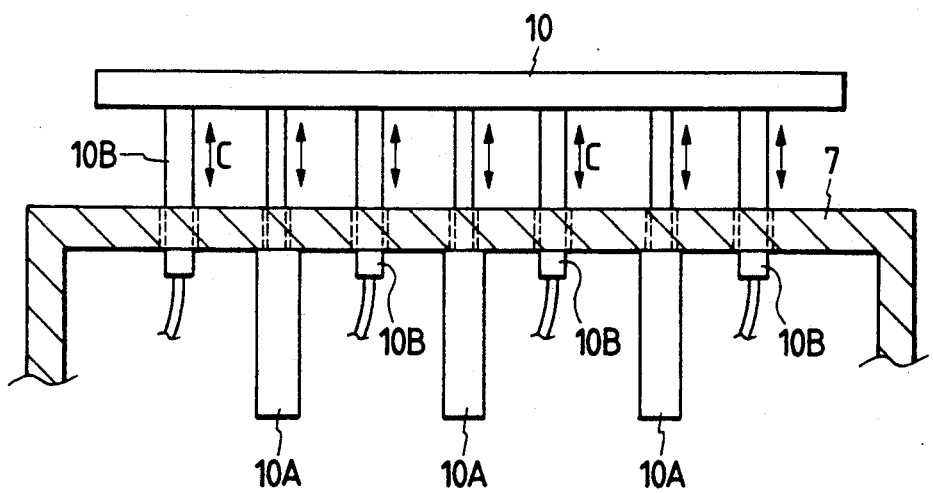
FIG. 4 is a cross-sectional view taken along the line 4—4 of FIG. 2.

In the vicinity of the path of feed of the laminate film 1B, a film leading-end-holding member 10 is provided between the main vacuum plate 6 and the film bonding position. The pair of film leading-end-holding members 10 are arranged respectively on the upper and lower sides of the board travel path I—I and spaced equidistantly therefrom. As shown in FIG. 4 which is a cross-sectional view taken along the line 4—4 of FIG. 2, the film leading-end-holding member 10 is designed to hold the cutting portion of the laminate film 1B and also to enable the forward end portion 6D of the main vacuum plate 6 to hold by suction a fresh leading end of the laminate film 1B from which the preceding length of the film has been cut. More specifically, the film leading-end-holding member 10 is movable toward and away from the path of feed of the laminate film 1B as indicated by a double-head arrow C. In FIG. 4, reference numerals 10B denote suction pipes. The film leading-end-holding member 10 is mounted on the apparatus body 7 through a drive source 10A. The drive source 10A comprises, for example, an air cylinder.

Figure 5:
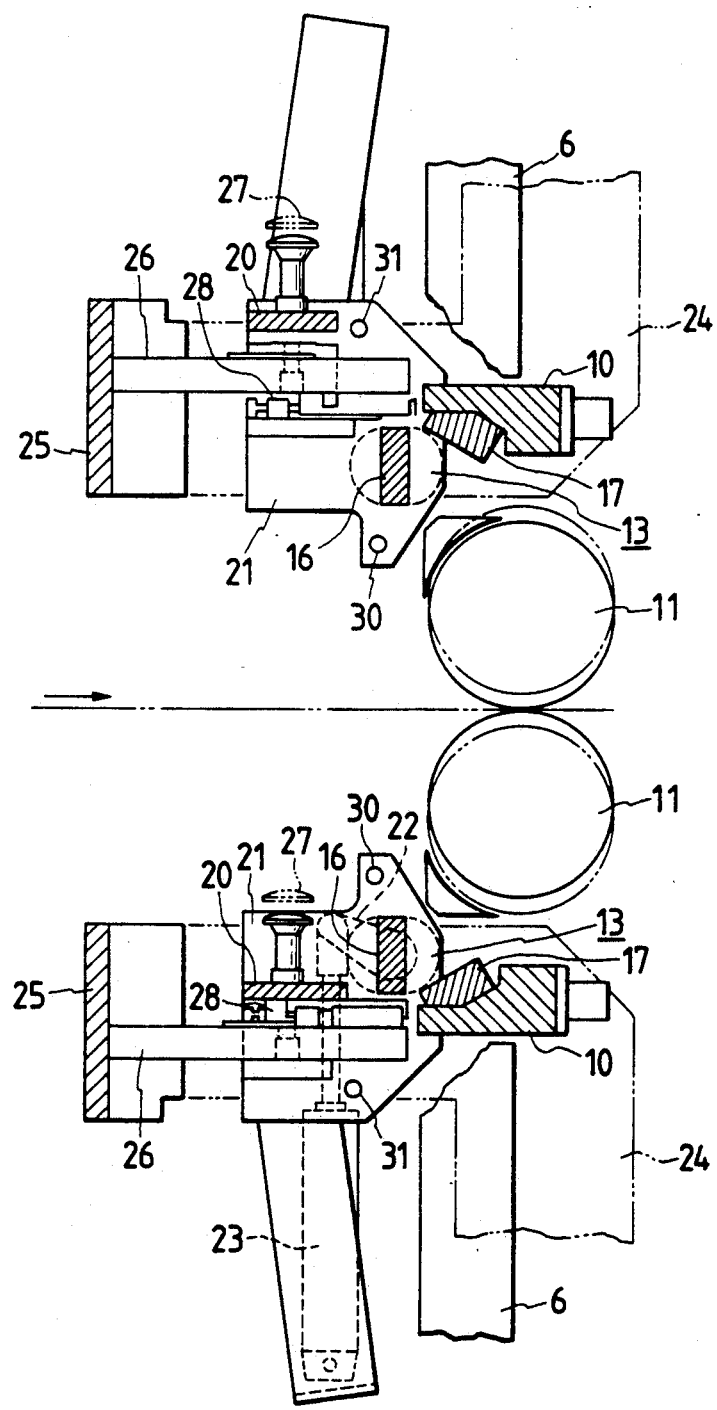
FIGS. 5, 6 and 7 are respectively a side-elevational view, a plan view and a front-elevational view of a portion of the apparatus of FIG. 1 including a rotary cutter.

The film leading-end-holding member 10 is also designed to hold the trailing end of the cut length of the laminate film 1B when the laminate film 1B is cut at its cutting portion. As shown in FIG. 5, a fixed blade 17 of a rotary cutter 13 is mounted on the film leading-end-holding member 10. More specifically, the rotary cutter 13 is movable toward and away from the reverse side of the laminate film 1B, together with the film leading-end-holding member 10. A rotary blade 16 of the rotary cutter 13 is mounted on the apparatus body 7 so as to be movable toward and away from the front side of the laminate film 1B.

Referring again to FIG. 1, thermocompression bonding-rollers 11 are always rotated so that spots of different temperatures will not develop on their surfaces. Each thermocompression bonding-roller 11 is movable between a retracted position indicated by a solid line and the film-bonding position indicated by a broken line.

When the thermocompression bonding-rollers 11 are moved toward the bonding position, the leading end of the laminate film 1B is held and automatically fed by rotation of the rollers. The pressure applied by the rollers will cause the laminate film 1B to bond to a film-bonding surface of the board 14 from its leading to trailing end over a predetermined distance. During the bonding process, the thermocompression bonding-rollers 11 and the board 14 are moved a predetermined distance in the direction of feed of the board 14 while the laminate film 1B is being bonded to the board under heat and pressure, and thereafter are moved in the direction opposite to the direction of feed of the board 14 so as to loosen the trailing edge of laminate film 1B.

A pair of vacuum bars 12 serve to hold by suction the trailing end of the laminate film 1B to be bonded by the thermocompression-bonding roller 11, so as to apply an appropriate tension to the laminate film 1B so that the laminate film 1B will not have wrinkles and the like. Each vacuum bar 12 is capable of rotating around a respective thermocompression-bonding roller 11. The constitution and operation of the vacuum suction bar 12 are described in detail in the Japanese Patent Application (OPI) No. 205140/86 (the term "OPI" as used herein means an "unexamined published application"), and are not described in detail herein. The pair of thermocompression rollers 11 as well as the pair of vacuum bars 12 are arranged respectively on the upper and lower sides of the board travel path I—I and spaced equidistantly therefrom.

The boards 14 for printed circuits are transferred along the board travel path I—I by a board conveying mechanism mounted within or on the film bonding apparatus. More specifically, the board conveying mechanism is designed to convey the boards 14 to the film bonding position, and then to transfer or move each board 14 from the film bonding position to an exposure position (the next stage) after the laminate film 1B is thermocompression-laminated. The board conveying mechanism broadly comprises drive rollers 15A and driven rollers 15B.

In the present invention, a rotary cutter 13 is provided as a cutter device for cutting the continuously-fed laminate film 1B to a predetermined length. Referring again to FIG. 5, the rotary cutter 13 is composed of a set of rotary blade 16 and fixed blade 17 both having a predetermined length and extending transversely of the laminate film 1B. As shown in FIGS. 5 to 9, the rotary blade 16 has a cutting edge 18 formed diagonally on an upper surface of its strip-like body. The rotary blade 16 has discs 19 mounted on opposite ends thereof and is rotatable about the axes of the discs 19 through a predetermined angle in normal and reverse directions, so that the rotary blade 16 cooperates with the fixed blade 17 to cut or shear the laminate film 1B disposed therebetween, the fixed blade 17 being supported on and disposed in contact with the outer peripheries of the discs 19. The fixed blade 17 is mounted on the film leading-end-holding member 10 through a sheet-like elastic member (for example, rigid rubber), and is movable toward and away from the path of feed of the laminate film 1B in the direction of the arrow C, as seen in FIGS. 1 and 8, together with the film leading-end-holding member 10.

Figure 6:
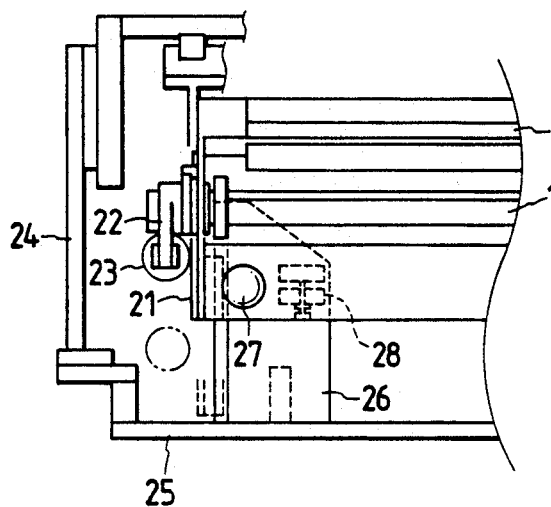
Figure 7:
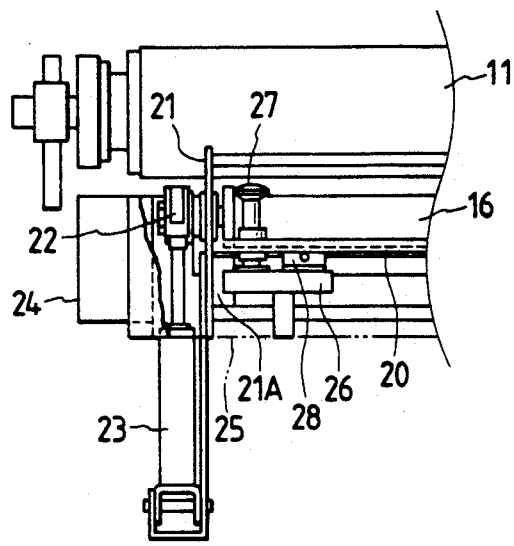
Figure 8:
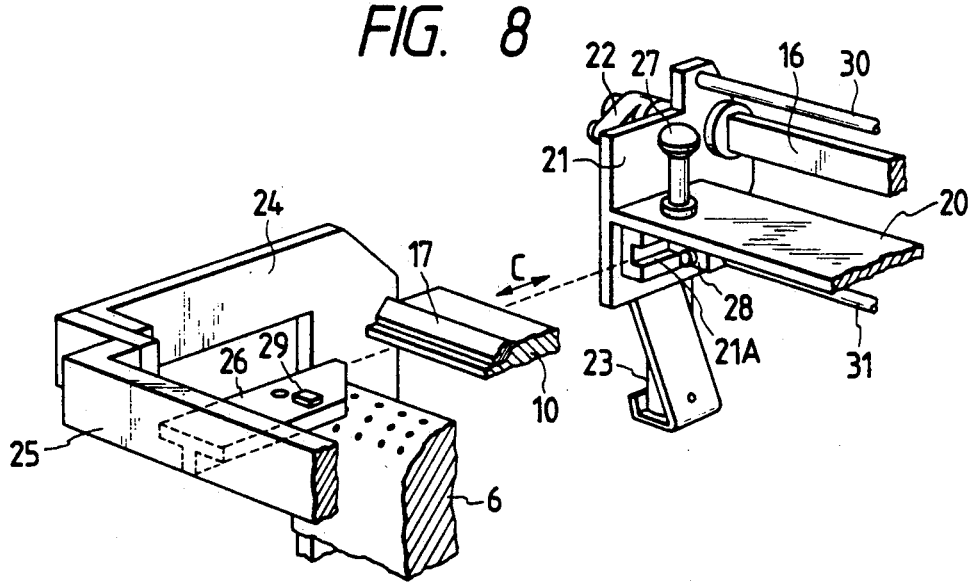
FIG. 8 is an exploded perspective view, showing a lower cutting device.
Figure 9:
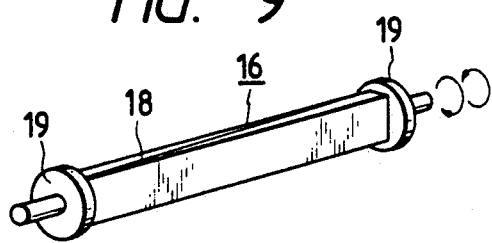
FIG. 9 is a perspective view of a rotary cutter shown in FIGS. 5 to 7.

Referring to FIGS. 5, 6 and 7, showing portions of the cutter 13, and FIG. 8, showing the lower rotary cutter 13 in an exploded manner, we see that the rotary blade 16 is rotatably supported by two side plates 21 of a slide bed 20 which is movable forward and backward relative to the bonding apparatus. A crank 22 mounted on a shaft end of the rotary blade 16 is reciprocally moved by an air cylinder 23 mounted on the side plate 21 so that the rotary blade 16 can be rotated in normal and reverse directions through a predetermined angle. The slide bed 20 is supported on a transverse plate 25 fixedly mounted horizontally on the frame of the bonding apparatus through L-shaped brackets 24. Two support plates 26 extend respectively from right and left-hand portions of the reverse side of the transverse plate 25, and are engaged respectively in engaging portion 21A formed respectively on the two side plates 21. Thus, the slide bed 20 is supported by the support plates 26 and is normally fixed thereto. However, by pulling up an engaging thumb piece 27, mounted on the upper surface of the slide bed 20, against the bias of a spring mounted therein, the slide bed 20 can slide freely. A stopper 28 with a set screw is mounted on the underside of the slide bed 20, and when the slide bed 20 is moved toward the fixed blade, the distal end of the set screw abuts against a projection 29 formed on the upper surface of the support plate 26 so as to always hold the rotary blade 16 in a predetermined position relative to the fixed blade 17. Air-applying pipes 30 and 21 are mounted at their opposite ends on the two side plates 21, and have air-applying apertures formed in their outer peripheries. The air, applied from these pipes when necessary, urges the laminate film 1B against the thermocompression bonding-roller 11 and the forward end portion of the main vacuum plate 6. The film leading-end-holding member 10 in this embodiment has suction apertures for holding the laminate film 1B against movement by suction when cutting the laminate film 1B.

The cutting operation of the laminate film 1B in the film bonding apparatus of this embodiment will now be briefly described.

Initially, the leading end of the laminate film 1B separated by the film separating roller 3 is manually disposed between the front face of the fixed blade 17 on the film leading-end-holding member 10 and the rear portion of the rotary blade 16 on the slide bed 20, and the leading end of the laminate film 1B is urged against the film leading-end-holding member 11 by the air from the air applying pipes 30 and 31. Then, the relevant parts are operated to carry out a continuous operation as is the case with a conventional apparatus.

In this case, as described above, the cutting of the laminate film 1B is carried out by rotating the rotary blade 16 and instantaneously shearing the laminate film 1B by the rotary blade 16 and the fixed blade 17. At this time, since the cutting edge 18 of the rotary blade 16 is slightly inclined relative to its axis, a resistance to the cutting is reduced, and therefore the cutting operation can be carried out quickly and positively. Further, even though the cutting edge 18 of the rotary blade 16 is thus slightly inclined relative to its axis, there is no risk that the laminate film 1B is cut obliquely, since the laminate film 1B is cut when the laminate film 1B is temporarily loosened. Further, when positioning the leading end of the laminate film 1B before starting the operation, the slide bed 20 can be easily pulled forwardly through the engaging thumb piece 27. After this pulling operation, it will suffice that the slide bed 20 is returned.

The bonding process (laminating under heat and pressure) will now be briefly described with reference to FIGS. 10 to 16 which show schematically important portions of the apparatus in various steps of the process.

Initially, as shown in FIG. 10, the leading end of the laminate film 1B separated by the film separating roller 3 is manually disposed at the film suction surface 10D of the film leading-end-holding member 10.

Then, suction is applied and the leading end of the laminate film 1B is held by the film suction surface 10D of the film leading-end-holding member 10. Finally, the film leading-end-holding member 10 is moved in the direction of the arrow C by a drive source 7F shown in FIG. 1 to move the leading end of the laminate film 1B away from the path of feed of the laminate film 1B and adjacent the forward end portion 6D of the main vacuum plate 6. Suction applied by end portion 6D will cause the leading end of the laminate film 1B to be held by the forward end portion 6D of the main vacuum plate 6, and permit the suction of surface 10D to be released as shown in FIG. 11. It should be noted that when a continuous operation is being carried out, a manual operation would not be involved since the leading end of the laminate film 1B cut by the rotary cutter 13 is held by the forward end portion 6D of the main vacuum plate 6 under suction.

With the leading edge of film 1B held by end portion 6D, the board conveying mechanism stops the leading end of the board 14 for the printed circuit at the film bonding position, which board has been conveyed by the drive rollers 15A and the driven rollers 15B along the board travel path I—I. This stopping operation is effected by sensing the leading end of the board 14 and then by stopping the operation of the drive rollers 15A in accordance with this sensing signal. The board 14 for the printed circuit, conveyed by the board conveying mechanism, passes between the two film leading-end-holding members 10 arranged respectively on the upper and lower sides of the board travel path I—I and spaced equidistantly therefrom.

As shown in FIG. 12, the main vacuum plate 6 and hence its forward end portion 6D are then moved in the direction of the arrow A toward the leading end of the surface (film bonding surface) of the board 14 which is stopped in the film bonding position, thereby bringing the leading end of the laminate film 1B to the film bonding position.

Next, as shown in FIG. 13, the holding of the laminate film 1B by the main vacuum plate 6 and its forward end 6D under suction is released, and the main vacuum plate 6 and hence its forward end portion 6D are moved to the film bonding position, and the forward end portion 6D is caused to abut against the film bonding surface of the leading end of the board 14 for the printed circuit.

Then, as shown in FIG. 14, the main vacuum plate 6 and hence its forward end portion 6D are moved away from the film bonding position. At this time, the main vacuum plate 6 and hence its forward end portion 6D are moved beyond their positions shown in FIG. 10 toward the supply roller 2. In accordance with this operation, the thermocompression bonding roller 11 starts to move from its retracted position to the film bonding position.

When the thermocompression bonding roller 11 reaches the film bonding position, it engages the leading tip end of the laminate film 1B under a suitable pressure. Then, board 14 is fed in a direction of an arrow E by the board conveying mechanism to start the laminating (bonding) under heat and pressure.

As shown in FIG. 15, the laminate film 1B is automatically fed by the rotation of the thermocompression bonding roller 11 so that the laminate film 1B is bonded onto the film bonding surface of the board 14 over a predetermined distance from its leading end toward its trailing end. At this time, the thermocompression bonding roller 11, while bonding the laminate film 1B to the board 14, is moved a predetermined distance together with the board 14 in the direction of feed of the board 14 as far as a position X indicated by a broken line in FIG. 15.

When the thermocompression bonding roller 11 and the board 14 are being moved in the direction of feed of the board 4 while bonding the laminate film 1B to the board 14, the laminated film 1B is fed from the supply roller 2 in accordance with such movement.

When the trailing end of the laminate film 1B reaches a predetermined position of the board conveying mechanism, this is sensed by a sensor provided in the board travel path. In accordance with a sensing signal from this sensor, the following operations are effected:

(a) The film leading-end-holding member 10 moves toward the laminate film 1B, and the main vacuum plate 6 and the film leading-end-holding member 10 hold the laminate film 1B by suction. In this case, the length of the laminate film 1B extending between the front end of the fixed blade 17 and that portion of the thermocompression bonding roller 11 pressed against the laminate film 1B is substantially equal to a length of that portion of the film bonding surface of the board 14 which still remains uncovered by the laminate film 1B.

(b) Also, in synchronism with the holding of the laminate film 1B by the film leading-end-holding member 10 under suction, the thermocompression bonding roller 11 and the board 14 are moved a predetermined distance in the direction opposite to the direction of travel of the board 14 as far as a position Y indicated by a solid line in FIG. 15. As a result of this movement and the suction-holding by the film leading-end-holding member 10, the laminate film 1B extending between the film leading-end-holding member 10 and the thermocompression bonding roller 11 is loosened. The thus loosened portion of the laminate film 1B is directed in the direction of feed of the board 14 by injecting air as indicated by an arrow F (FIG. 16).

As shown in FIG. 16, the laminate film 1B is cut by the rotary cutter 13 while the laminate film 1B is kept loosened. A length of the laminate film thus cut from the continuous laminate film 1B corresponds to the length of the board 14 in the direction of feed of the board 14.

Immediately before this cutting operation, the suction-holding by the main vacuum plate 6 and the film leading-end-holding member 11 is released.

Then, the trailing end portion of the cut length of the laminate film 1B is bonded to the trailing end portion of the film bonding surface of the board 14 by the thermocompression bonding roller 11. In other words, through the rotation of the thermocompression bonding roller 11 and the movement of the board 14, the laminate film 1B is sequentially thermocompression-laminated from its leading end onto the board 14 from the leading to trailing end of the board 14. Since the main vacuum plate 6 is in its inoperative condition to ceases its suction-holding operation, the laminate film 1B is automatically fed sequentially to the film bonding position through the rotation of the thermocompression roller 11 and the movement of the board 14. The vacuum bars 12 are in their operative condition to effect the suction-holding to apply an appropriate tension to the laminate film 1B to be thermocompression-laminated to thereby prevent wrinkles or the like from developing therein.

Finally, the trailing end portion of the cut length of the laminate film 1B is thermocompression-laminated to the trailing end portion of the film bonding surface of the board 14, thus completing the thermocompression-laminating. The vacuum bars 12 are rotated, and the film leading-end-holding member 10 is retracted, or the thermocompression bonding roller 11 is retracted, or the thermocompression bonding roller 11 may be slightly moved to an extent not to interfere with the operation, with the vacuum bars rotated. The suction-holding continues immediately before the thermocompression-laminating is completed, so as to apply an appropriate tension to the laminate film 1B to thereby prevent wrinkles or the like from developing therein. When the thermocompression laminating is completed, the board 14 is transferred to the next stage, that is, an exposure device.

Thus, the leading end of the continuous laminate film 1B is held by the vacuum bars 12 (film feed members) under suction, and the vacuum bars 12 are moved toward the leading end of the film bonding surface of the board 14, fed to the film bonding position, to feed the leading end of the continuous laminate film 1B and to retain the leading end of this laminate film 1B at the film bonding position. The vacuum bars 12 are moved away from the board 14, and the thermocompression bonding roller 11 is moved toward the leading end of the laminate film 1B retained at the film bonding position. The thermocompression bonding roller 11 is rotated to automatically feed the laminate film 1B and to bond the laminate film 1B to a small given area of the film bonding surface of the board 14 from the leading end of the board toward its trailing end. At this time, the thermocompression bonding roller 11, while bonding the laminate film to the board 4, is moved together with the board 14 the predetermined distance in the direction of feed of the board 14, and thereafter is moved in the direction opposite to the direction of feed of the board 4 to loosen the laminate film 1B. Then, the laminate film 1B is cut in such a manner that the thus cut length of the laminate film corresponds to the length of the board 4 in the direction of feed of the board 4. The trailing end portion of the cut length of the laminate film 1B is bonded to the trailing end portion of the film bonding surface of the board 14. Therefore, with such a simple construction, the wide laminate film 1B can be rapidly and positively cut and bonded to the board 14 for the printed circuit.

By virtue of the provision of the rotary cutter 13 which comprises the rotary blade 16 and the fixed blade 17 both arranged across the laminate film 1B, the laminate film 1B can be cut through the cooperation of the rotary blade 16 and the fixed blade 17 upon instantaneous rotation of the rotary blade 16. Therefore, the wide laminate film 1B can be rapidly and positively cut.

Further, since the members 21 rotatably supporting the rotary blade 16 are designed to be movable forwardly, the insertion of the continuous film before starting the operation can be facilitated, which improves the operability.

Finally, the rotary blade 16 is angularly movably mounted at its opposite ends on the slide bed 20 movable toward and away from the laminate film 1B on the support plates 26 extending from the base 25. The slide bed 20 can be fixed in a predetermined position relative to the support plates 26 and also can be moved forwardly away from the laminate film 1B. The fixed blade 17 is mounted on the film leading-end-holding member 10 movable toward and away from the reverse side of the laminate film 1B. Therefore, the laminate film 1B can be cut rapidly, and the guide members for the rotary cutter are prevented from being subjected to an impact.

Figure 17:
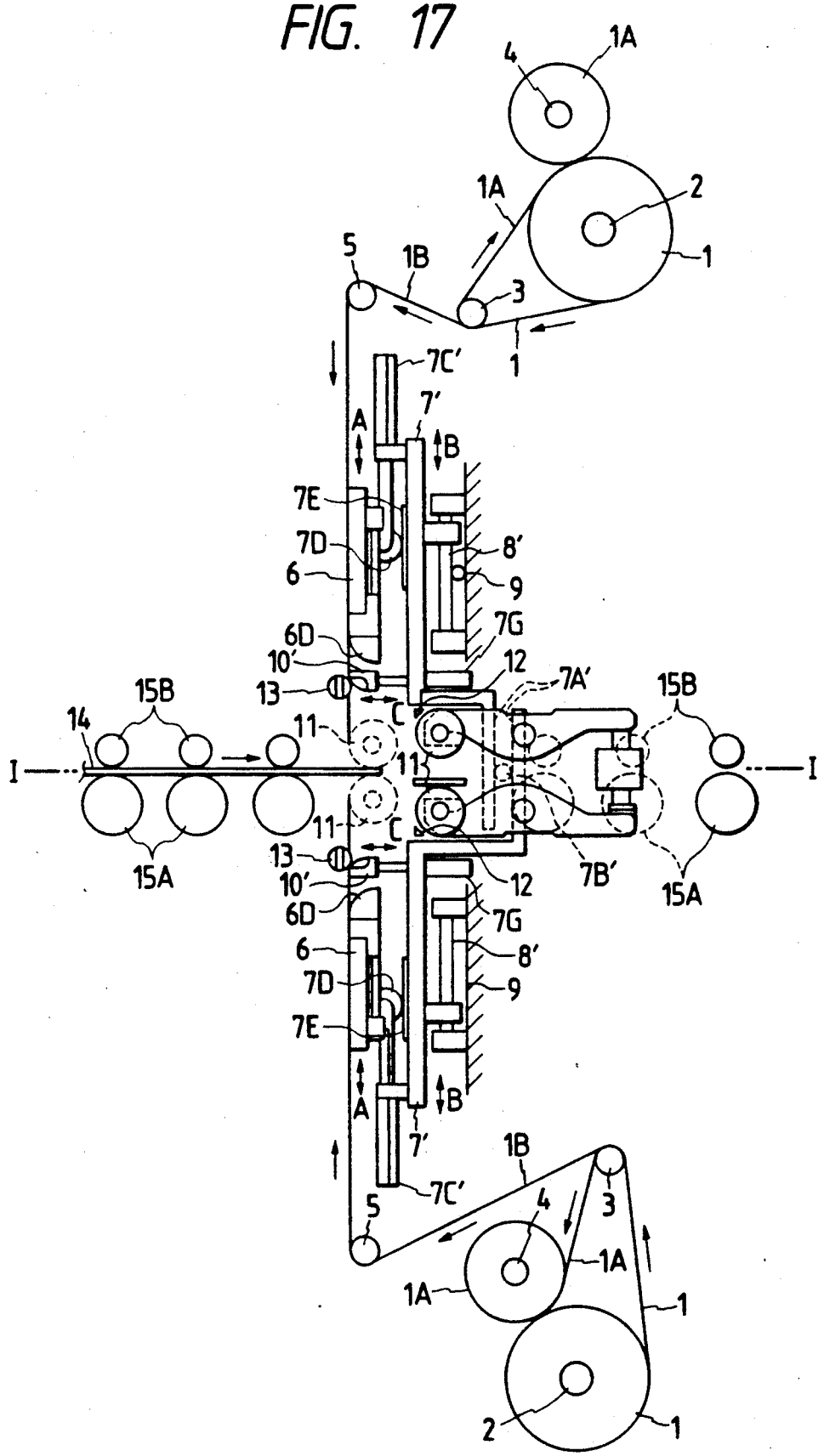
FIG. 17 is a schematic view of an overall construction of an alternative embodiment of the apparatus of the present invention.

FIG. 17 shows another embodiment of an apparatus that can incorporate the present invention. In this Figure, the components having an identity with those of FIG. 1 are identified by the same reference numbers; those having only a similar function but a different structure are signified by the same reference numeral primed. In FIG. 17, as in FIG. 1, the film 1B separated from the light-transmissible resin film 1A is fed to a main vacuum suction plate 6 along a tension roller 5. The main vacuum suction plate 6, is moved toward and away from a film bonding position in directions A shown in FIG. 1. However, the plate 6 is provided on a support member 7' attached by a guide rail member 8' to the casing 9' of the film bonding apparatus. The support member 7' is slidable on the guide rail member 8' in directions B shown in FIG. 17. A pair of main vacuum suction plates 6 and a pair of support members 7' are provided over and under the base plate conveyance passage I—I. The upper and the lower support members 7' are coupled to a rack and pinion mechanism made of racks 7A' and a pinion 7B' engaged with the racks so that the support members are moved toward and away from each other by a driver such as an air cylinder.

The main vacuum suction plate 6 can be moved in the directions A either together with the support member 7' or separately therefrom. The plate 6 can be moved in the directions A by a rack and pinion mechanism and a driver 7C' provided on the support member 7' and coupled to the mechanism. The mechanism is made of a pinion 7D coupled to the shaft of the driver 7C', a rack 7E provided on the support member 7', and another rack 7E provided on the rear of the plate 6. The downstream end 6D of the plate 6, which is located nearer the film bonding position than the upstream end of the plate, has a film suction surface shaped as an arc, and has a plurality of film suction holes for sucking and holding the leading edge portion of the film 1B on the arc-shaped suction surface against the elasticity of the film. The leading edge portion of the film 1B sucked and held on the downstream end 6D of the plate 6 is fed to the film bonding position by moving the plate toward the position in the direction A.

A holding member 10' for the cutoff of the stratified film 1B is provided near the feed passage for the laminated film 1B between the main vacuum suction plate 6 and the film bonding position. A pair of such holding members 10' are provided over and under the base plate conveyance passage I—I. Each holding member 10' functions so that the next leading edge portion of the film, which is created due to the cutoff of the film, is sucked and held on the downstream end 6D of the main vacuum suction plate 6. For these purposes, the holding member 10' can be moved toward and away from the feed passage for the film 1B in directions C by a driver 7G such as an air cylinder and coupled between the holding member and the support member 7'. When the film 1B is to be cut off in the cutoff position, the trailing edge portion of the film is held by the holding member 10' so that while the cut-off film 1B is bonded, under heat and pressure, to the base plate 14 by the film apparatus, the trailing edge portion of the film is loosened between the holding member and a vacuum suction bar 12 which is a film pinching or holding bar. The speed of the feed of the film 1B by the main vacuum suction plate 6 is made higher than the circumferential velocity of a heat and pressure roller 11, which is equal to the speed of the bonding of the film 1B to the base plate 14, so that the trailing edge portion of the film is loosened. As a result, the film 1B can be cut off while being bonded, under heat and pressure, to the base plate 14.

As described above, according to the present invention, with a simple construction, the wide laminate film can be cut rapidly and positively and be bonded to the board.

The continuous film can be cut through the cooperation of the rotary blade and the fixed blade upon instantaneous rotation of the rotary blade. Therefore, the wide laminate film can be cut rapidly and positively and be bonded to the board.

Further, since the insertion of the continuous film before starting the operation is facilitated, an improved operability can be achieved.

As is apparent, it is possible to separate the fixed blade 17 away from the leading-edge holding member 10. Namely, it is possible to provide the fixed blade 17 and the holding member 10 independently of each other.

Figure 18:
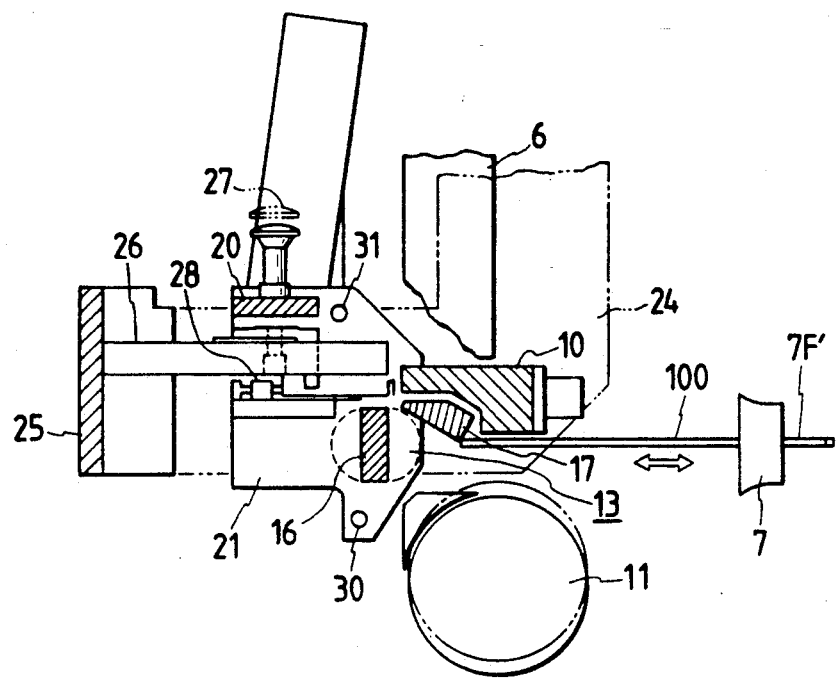
FIGS. 18 and 19 show modifications according to the invention.

In this connection, although in FIG. 5, the fixed blade 17 is fixed directly to the film leading end holding member 10, FIG. 18 shows the modification in which the fixed blade 17 is not directly fixed to the holding member but may be movable back and forth independently of the holding member 10. The fixed blade 17 is drivingly moved by the air cylinder 7F' which is provided on the apparatus body 7. In this construction, it is necessary to first move the holding member 10 and then move the fixed blade 17 in the case where the holding member 10 is to be moved rightward. Alternatively, it is possible to move substantially at the same time the fixed blade 17 and the holding member 10. In the case where the two members are to be moved leftward, it is necessary to first move the fixed blade 17 and then move the holding member 17 or otherwise to move the two members substantially at the same time. This structure may enjoy the advantage in that it is easy to set any positional relationship as desired, and it is easy to ensure the holding of the trailing end of the film.

Figure 19:
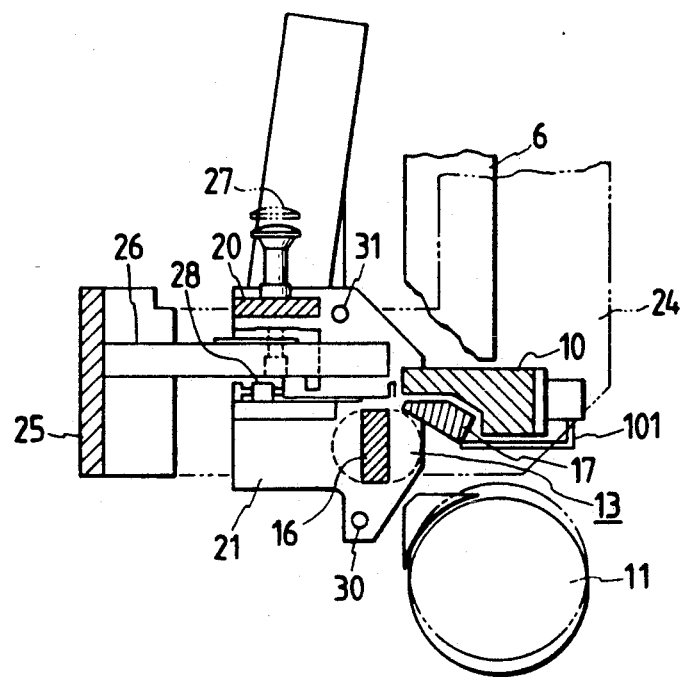

FIG. 19 shows another modification in which the holding member 10 and the fixed blade 17 are separately provided but the two members may be moved simultaneously through a support bar 101.

While the invention has been specifically described with reference to the embodiment thereof, the invention is not to be restricted to this embodiment, and various modifications can be made without departing from the scope of the invention as recited in the appended claims.

What is claimed is:

1. A film bonding apparatus for bonding a continuous supply of film to a board, comprising:
   a body for providing structural support to the apparatus;
   means for conveying the boards to a film bonding position and for retracting boards from said film bonding position;
   a film feed member being capable of temporarily securing a leading end of said continuous film thereto and capable of feeding said leading end of the continuous film to said film bonding position;
   means for holding said leading end of the film comprising a holding surface disposed proximate said film bonding position and being adapted for contact with said leading end of the film fed by said film feed member to said film bonding position, said holding surface having apertures formed thereon for holding said leading end of the film by suction;
   rotary cutter means comprising a fixed blade provided in the vicinity of said holding member and a rotary blade mounted on said body, said rotary cutter means being movable toward and away from a first side of said film;
   moving means, for moving said holding means toward and away from a second side of said film, mounted on said body; and
   a compression bonding roller for bonding said film held by said film feed member in said film bonding position to said film bonding surface, said compression bonding roller is movable in a direction toward said leading end of film held by said film feed member is said film bonding position, said film is automatically advanced by virtue of rotation of said compression bonding roller so as to bond film to said film bonding surface over a predetermined distance, said compression bonding roller being moved in concert with said board a first predetermined distance in a direction of feed of said board while the film is being bonded to said board, said compression bonding roller subsequently being capable of moving a second predetermined distance in a direction opposite to a feed of said board so as to loosen said film.

2. A film bonding apparatus, as claimed in claim 1, wherein said rotary blade is rotatably mounted, at opposite ends thereof, on a slide bed, said slide bed is movable toward and away from said first side of said film on a support plate extending from a base, said slide be being capable of being fixed in a predetermined position relative to said support plate, said slide bed also being capable of moving away from said first side.

3. A film bonding apparatus, as claimed in claim 2, wherein said rotary blade and said fixed blade, each having a length greater than a width of said film, said rotary blade and said fixed blade being mounted transverse to a direction of feed of said film.

4. A film bonding apparatus for bonding a continuous supply of film to a board, comprising:

a body for providing structural support to the apparatus;

means for conveying the boards to a film bonding position and for tracking boards from said bonding position;

a film feed member capable of temporarily securing a leading end of said continuous film thereto and capable of feeding said leading end of the continuous film through said film bonding position;

means for holding said leading end of the film comprising a holding surface disposed proximate said film bonding position and being adapted for contact with said leading end of the film fed by said film feeding member to said film bonding position, said holding surface having apertures formed thereon for holding said leading end of the film by suction;

rotary cutter means comprising a base, rotary cutting means, fixed cutting means, support plates coupled to said base, a holding member, and a sliding rest capable of being moved back and forth relative to said first side of said film while remaining on said support plate, said rotary blade being supported at both ends thereof by said sliding rest, so that said rotary cutting blade can be turned through a prescribed angle, said fixed cutting blade is fixedly attached to said holding member, said rotary cutting member and said fixed cutting member are oriented so as to extend across said film in a transverse direction;

moving means for moving said holding means toward and away from a second side of said film mounted on said body; and a compression bonding roller for bonding said film held by said film feed member in said film bonding position to said film bonding surface.

* * * * *